(12) United States Patent
Chatty et al.

(10) Patent No.: US 7,457,086 B2
(45) Date of Patent: Nov. 25, 2008

(54) HIGH VOLTAGE ESD POWER CLAMP

(75) Inventors: Kiran V. Chatty, Williston, VT (US); Robert J. Gauthier, Jr., Hinesburg, VT (US); Mahmoud A. Mousa, S. Burlington, VT (US); Mujahid Muhammad, Essex Junction, VT (US); Christopher S. Putnam, Hinesburg, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/614,659

(22) Filed: Dec. 21, 2006

(65) Prior Publication Data

US 2007/0097570 A1    May 3, 2007

Related U.S. Application Data

(63) Continuation of application No. 10/711,748, filed on Oct. 1, 2004, now Pat. No. 7,203,045.

(51) Int. Cl.
  H02H 3/20    (2006.01)
  H02H 3/22    (2006.01)
  H02H 9/04    (2006.01)
(52) U.S. Cl. ................... 361/56; 361/111; 361/91.1
(58) Field of Classification Search ............. 361/56, 361/91.1, 111
  See application file for complete search history.

(56) References Cited

U.S. PATENT DOCUMENTS

| 4,916,381 | A |   | 4/1990  | Gelecinskyj et al. |
|-----------|---|---|---------|--------------------|
| 5,239,440 | A |   | 8/1993  | Merrill            |
| 5,345,356 | A |   | 9/1994  | Pianka             |
| 5,345,357 | A |   | 9/1994  | Pianka             |
| 5,400,202 | A |   | 3/1995  | Metz et al.        |
| 5,508,649 | A |   | 4/1996  | Shay               |
| 5,561,577 | A | * | 10/1996 | Motley ......... 361/56 |
| 5,596,474 | A |   | 1/1997  | Wada et al.        |
| 5,852,375 | A |   | 12/1998 | Byrne et al.       |
| 5,932,918 | A |   | 8/1999  | Krakauer           |
| 5,946,177 | A |   | 8/1999  | Miller et al.      |
| 6,140,682 | A |   | 10/2000 | Liu et al.         |
| 6,147,538 | A |   | 11/2000 | Andresen et al.    |
| 6,236,238 | B1|   | 5/2001  | Tanji et al.       |
| 6,327,126 | B1| * | 12/2001 | Miller et al. ...... 361/56 |

(Continued)

OTHER PUBLICATIONS

Steven H. Voldman, "The State of the Art of Electrostatic Discharge Protection: Physics, Technology, Circuits, Design, Stimulation, and Scaling", IEEE Journal of Solid-States Circuit, vol. 34, No. 9, Sep. 1999, pp. 1272-1282.

Primary Examiner—Michael J Sherry
Assistant Examiner—Zeev Kitov
(74) Attorney, Agent, or Firm—Richard M. Kotulak; Greenblum & Bernstein P.L.C.

(57) ABSTRACT

Method and device for protecting against electrostatic discharge. The method includes configuring a gate of at least one upper transistor of a transistor network connected between power rails to be biased to a prescribed value, and coupling an electrostatic discharge event to a gate of a lower transistor of the transistor network. The at least one upper and at least one lower transistors of the transistor network are respectively coupled between the power rails from a higher voltage to a lower voltage.

2 Claims, 7 Drawing Sheets

U.S. PATENT DOCUMENTS

| | | |
|---|---|---|
| 6,433,979 B1 | 8/2002 | Yu |
| 6,459,553 B1 * | 10/2002 | Drapkin et al. ............... 361/56 |
| 6,556,398 B1 | 4/2003 | Chen |
| 6,657,835 B2 | 12/2003 | Ker et al. |
| 6,919,602 B2 | 7/2005 | Lin et al. |
| 7,187,527 B2 * | 3/2007 | Su et al. .................. 361/56 |
| 2005/0173727 A1 * | 8/2005 | Manna et al. ............... 257/173 |

* cited by examiner

HIGH VOLTAGE ESD POWER CLAMP

RELATED APPLICATION

This application is a continuation of U.S. patent application Ser. No. 10/711,748 filed Oct. 1, 2004, the disclosure of which is expressly incorporated by reference herein in its entirety.

FIELD OF THE INVENTION

The invention relates to power clamps, and more particularly to high voltage ESD power clamps for integrated circuits.

BACKGROUND DESCRIPTION

Due to their small size and low operating voltages, integrated circuits or chips are susceptible to damage from electrostatic discharge ("ESD"). For example, one model for ESD considered in the industry is the H.B.M. (human body model or "HBM"). It is an industry standard to protect chips to withstand an HBM discharge of 2,000 volts with current transients corresponding to about 1.3 amps. Though an HBM event is short in duration, such an event if coupled directly to an input or output pin on a chip without ESD protection, will almost certainly destroy the circuitry of the chip. ESD events which are transmitted to a chip frequently travel through the chip on the power supply rail or simply power rails (i.e., power or voltage supply rail and ground rail) of the power supplies internal to the chip. Accordingly, ESD events will typically cause large voltage and current transients across the power rails of the chip. Thus, circuits which protect against ESD damage in a chip typically allow the ESD event to be discharged from the power supply rail of the chip to a ground rail. Such an ESD protection circuit is typically called a "power clamp."

Related art power clamps include diode-based circuits. In a diode-based power clamp, diodes having a prescribed turn-on voltage are connected between a power rail and a ground rail. When the voltage potential between the power rails exceeds the prescribed voltage, the diodes turn on and short the power rails to one another. Diode-based power clamps have certain disadvantages, including a relatively high on-resistance. Additionally, the turn-on voltage may be relatively high to allow the circuit to operate at its normal voltage, multiple diodes must be connected in series, thereby increasing the on-resistance of the power clamp. Power clamps having a high internal on-resistance are less effective because voltage between a power rail and a ground rail must be kept low during the ESD event, thereby precluding power clamps having high on-resistances. In addition, grounded-gate nFETs and silicon controlled rectifiers ("SCR") are also used for ESD protection between a power rail and a ground rail. The disadvantages of these devices are very high trigger voltages and very high on-resistances, respectively.

Some chip designs include multiple power supplies, where at least one of the power supplies operates at a voltage higher than the native voltage of the devices in the technology. As such, the power clamp must be able to withstand the operating voltage of the higher voltage power supplies, while being fabricated for the native technology voltages of the chip.

One type of power clamp relies on a single nFET between a power rail and a ground rail where the nFET is in the off-state during the normal operation of the chip, but turns on during the transient pulse of an ESD event. Once in the on-state, the nFET provides a low-resistance path to the anomalous voltage spike from the power supply rail to the ground rail.

More specifically, a typical power clamp uses a single nFET positioned between a voltage or power supply rail and ground rail. A typical power clamp also includes a RC circuit having a resistor and a capacitor connected in series with one another between the power supply rail and the ground rail. The RC circuit is connected to the gate of the nFET between the capacitor and the resistor.

In operation, the nFET of the typical power supply is biased into an off-state by the RC circuit during normal operation. When a voltage spike or transient occurs on the power supply rail of sufficient amplitude and frequency to qualify as an ESD event, a portion of the ESD event is coupled to the gate of the nFET through the RC circuit. When the ESD event occurs, the RC circuit biases the nFET into the on-state, thereby shorting the power supply rail to the ground.

The values of the resistor and the capacitor of the RC circuit are commonly chosen to have an RC time constant of about 1 microsecond. The RC circuit is configured to function as a high pass filter which will trigger the nFET into the on-state when an ESD event occurs on the power supply rail. The capacitor and the resistor together form a trigger circuit. The trigger circuit may be considered to function similarly to a high-pass filter and will allow a high frequency voltage event, such as an ESD event, to be transmitted to the gate of the nFET to switch it to the on-state.

nFETs used for power clamps should have low resistance to effectively shunt power to ground under ESD conditions. Additionally, the operating voltage of the power supply incorporating the power clamp cannot be above the maximum allowed nFET voltage, otherwise, the nFET will be damaged during normal operation.

SUMMARY OF THE INVENTION

In a first aspect of the invention, a power clamp for an integrated circuit includes a transistor network connected between a voltage source and a ground, and a bias network configured to bias a gate of a first transistor of the transistor network to a portion of a voltage value of the voltage source. The power clamp also includes a trigger network configured to communicate the occurrence of an ESD event to the gate of a second transistor of the transistor network.

In another aspect of the invention, a power clamp for an integrated circuit includes at least an upper and a lower nFET connected in series with one another between a pair of power supply rails, and a voltage divider configured to bias a gate of the upper nFET to a prescribed value. The power clamp also includes a low frequency filter connected to a gate of the lower nFET and configured to filter out low frequency signals between at least one power supply rail and the gate of the lower nFET.

In another aspect of the invention, a method of protecting against electrostatic discharge includes connecting a transistor network between a pair of power supply rails, and biasing a gate of at least one upper transistor of the transistor network to a prescribed value. The method also includes coupling an electrostatic discharge event to a gate of a lower transistor of the transistor network.

DETAILED DESCRIPTION OF EMBODIMENTS OF THE INVENTION

Embodiments of the invention involve multiple transistors, such as nFETs, connected in series with one another between the power supply rails. At least one of the transistors is biased into a partially on-state during normal operation of the chip. Thus, none of the transistors are exposed to the full voltage potential between the power rails. A trigger network, such as an RC circuit, will turn at least one of the unbiased transistors into the on-state while the first network turns the biased transistors into the fully on-state during an ESD event. With all the transistors in the on-state during an ESD event, any voltage and circuit spikes are shorted from the power supply rail to the ground rail. As discussed below, other configurations also fall within the scope of the invention, all protecting against damage from an ESD event.

Figure 1:
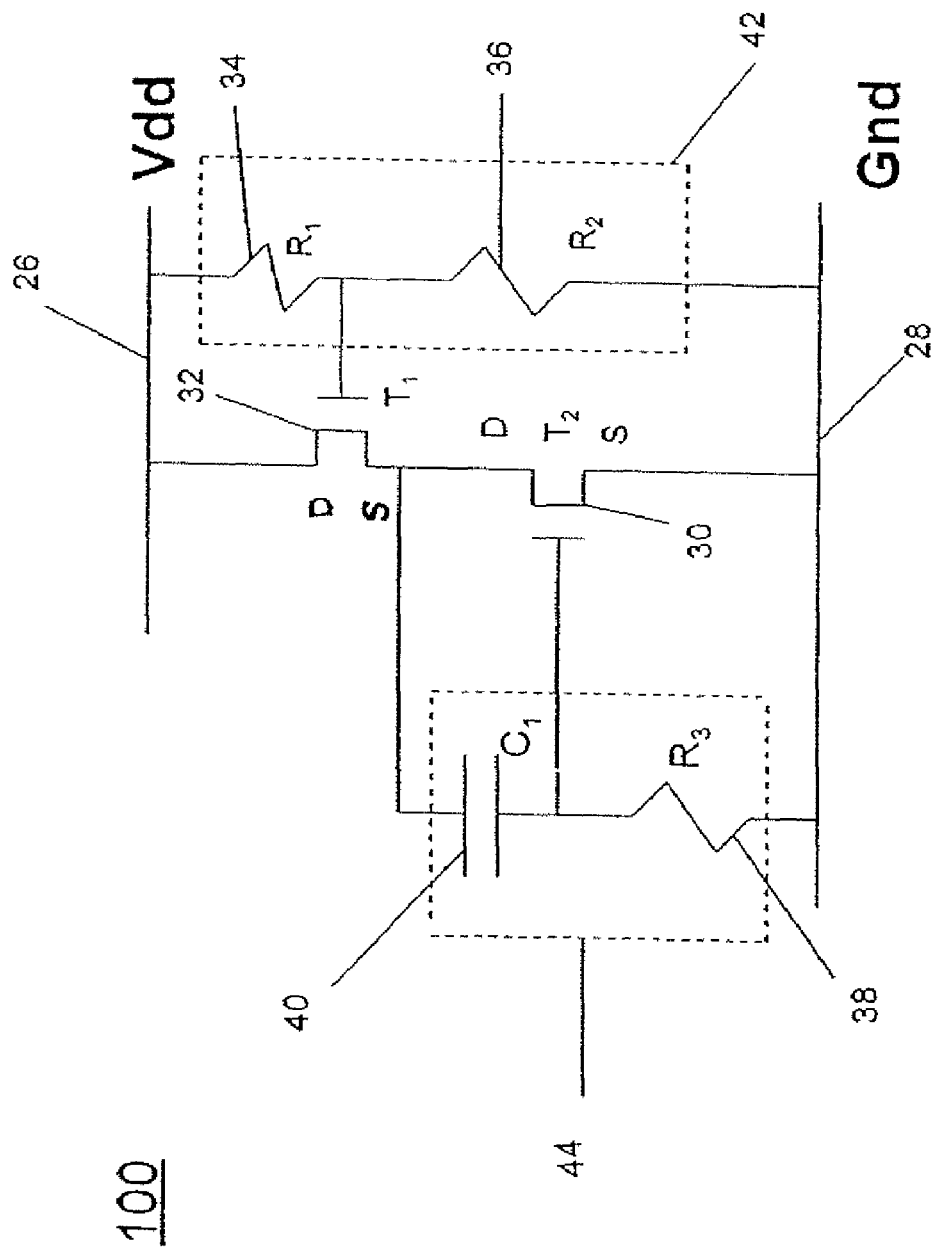
FIG. 1 illustrates an embodiment of the invention having an RC trigger.

Referring to FIG. 1, an embodiment of a power clamp in accordance with the invention is shown. The power clamp 100 is connected between a power supply rail 26 and a ground rail 28. A first nFET 32 and a second nFET 30 are connected in series with one another between the power supply rail 26 and the ground rail 28. The drain of the first nFET 32 is connected to the power supply rail 26, and the source of the first nFET 32 is connected to the drain of the second nFET 30. The source of the second nFET 30 is connected to the ground rail 28. A first resistor 34, and a second resistor 36 are connected in series with one another between the power supply voltage rail 26 and the ground rail 28. The gate of the first nFET, 32 is connected to the output of the first resistor 34 and the input of the second resistor 36. Together, the first resistor 34 and the second resistor 36 form a bias network 42.

A trigger circuit 44 includes a first capacitor 40 connected to a third resistor 38. The input of the first capacitor 40 is connected to the source of the first nFET 32 and the drain of the second nFET 30. The output of the first capacitor 40 is connected to the input of the third resistor 38. The output of the third resistor 38 is connected to the ground rail 28.

The output of the first capacitor 40, and the input of the third resistor 38 are connected to the gate of the second nFET 30. Accordingly, the second nFET 30 has its gate connected to the trigger circuit 44, which is essentially a RC circuit. The trigger circuit 44 is configured to have a RC time constant to allow high frequency events, such as an ESD event, to be coupled to the gate of the second nFET 30.

In normal operation of the power supply, (i.e., in absence of an ESD event), the voltage applied between the power supply rail 26 and the ground rail 28, may be higher than the native voltage of the components of the power clamp. However, the design of power clamp 100 allows for the voltage drop between the power supply rail 26 and the ground clamp 28 to be distributed across more than one device, thus insuring that each device operates within its native voltage parameters.

For example, the bias network 42 tends to function as a voltage divider, and thus its voltage at the output of 34 is less than the voltage across the power rail 26 and the ground rail 28. Accordingly, the output of the first resistor 34, which is coupled to the gate of the first nFET 32 is configured to bias the first nFET 32 into a partially on-state. As such, a predetermined fraction of the total voltage of the power supply rail 26 is coupled by the first nFET 32 into the second nFET 30, which is in the off-state during the normal operation of the power supply. Accordingly, in normal operations, the first nFET 32 is in the partially on-state and transmits a fraction of the voltage of the power supply rail 26 to the second nFET 30, which is in the off-state.

When a high frequency high voltage transient occurs on the power supply rail 26, such as in an ESD event, the high frequency high voltage signal is transmitted through the first nFET 32 and is received by the trigger circuit 44. Since the trigger circuit 44 is a high pass filter and the voltage transient is a high frequency voltage signal, the trigger circuit 44 transmits the voltage transient to the gate of the second nFET 30 thereby switching the second nFET 30 to the on-state. Additionally, the high voltage transient further biases the gate of the first nFET 32 and thus places the first nFET 32 into the fully on-state. With both the first nFET 32 and the second nFET 30 in the on-state, the two nFETs, 32 and 30, short the high voltage transient from the power supply rail 26 to the ground rail 28.

The power clamp 100 may be configured to work with any voltage supply regardless of output voltage by adding additional nFETs in series with the nFETs of the power clamp 100, with a corresponding addition of resistors to the bias network 42. Thus, each nFET can be connected to the bias network to have the gate biased to the appropriate voltage during normal operation of the power supply.

Figure 2:
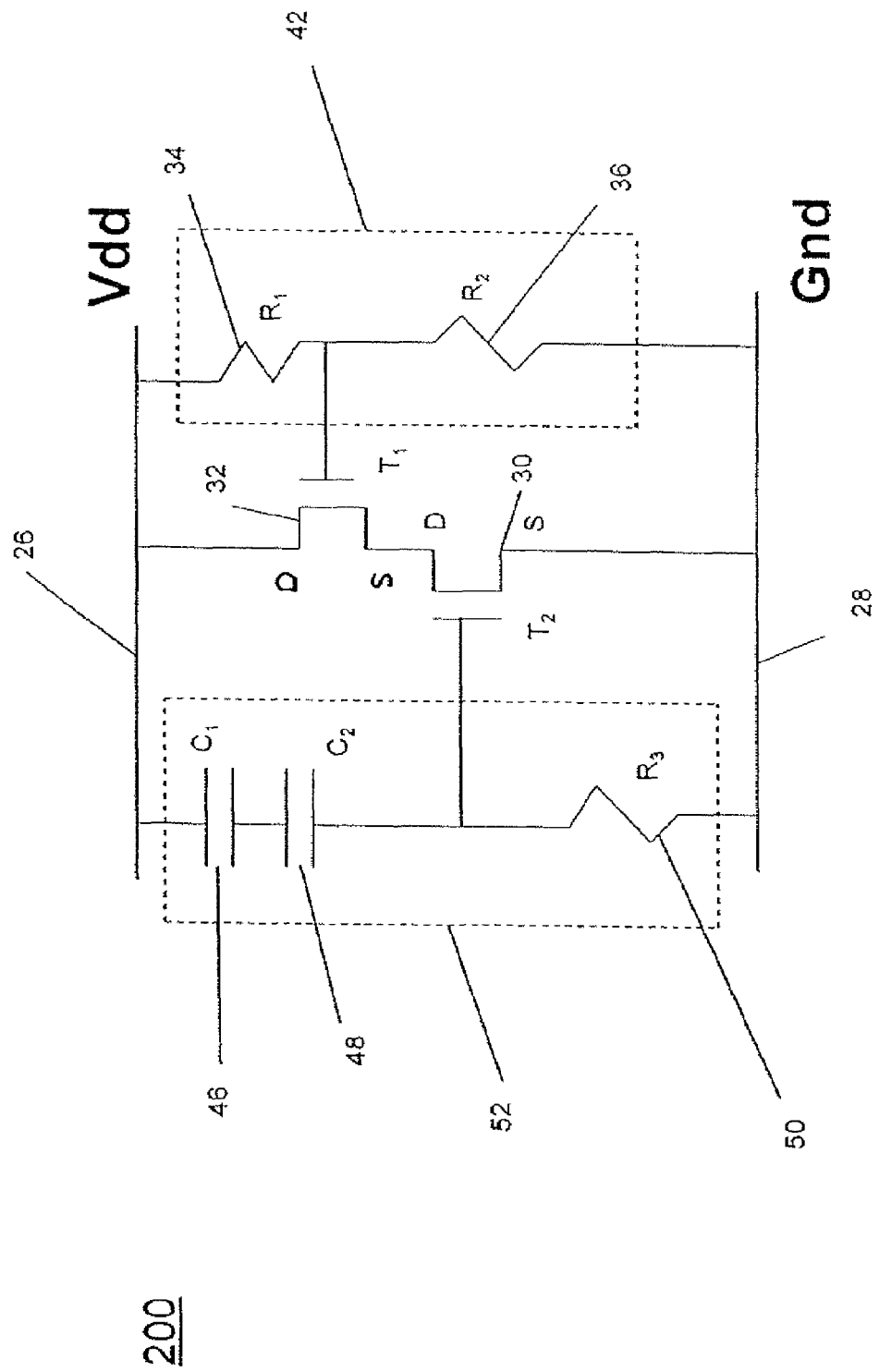
FIG. 2 illustrates an embodiment of the invention having an RC trigger.

Referring to FIG. 2, an embodiment of the power clamp 200 is shown in accordance with the invention. The power clamp 200 is connected to a power supply rail 26 and a ground rail 28. A first nFET 32 and a second nFET 30 are connected in series with one another between the power supply rail 26 and the ground rail 28. A bias network 42, having a first resistor 34 and a second resistor 36 are connected in series with one another between the power supply rail 26 and the ground rail 28. The output of the first resistor 34 is connected to the gate of the first nFET 32. A trigger circuit 52, having a first capacitor 46 and a second capacitor 48 connected in series with one another is connected in series with a third resistor 50. The trigger circuit 52 is connected between the power supply rail 26 and the ground rail 28. Also, the trigger circuit 52 has the output of the second capacitor 48 and the input of the third resistor 50 connected to the gate of the second nFET 30.

The power clamp 200 functions similarly to the power clamp 100 as discussed above. Specifically, the bias network 42, biases the first nFET 32 into a partially on-state. With the nFET 32 in a partially on-state, the second nFET 30 receives a fraction of the voltage of the power supply rail 26 during normal operation of the power supply. The trigger network 52 functions as a RC circuit having high pass filter properties. The first and second capacitors, 46 and 48, function as a voltage divider (i.e. the two capacitors are used to limit the voltage across each capacitor). Accordingly, the output of the second capacitor 48 is a fraction of the voltage of the power supply rail 26 during a voltage spike, otherwise the gate of the nFET 30 is at ground during normal operation. As such, the trigger circuit 52 can be connected directly to the power supply rail 26. Thus, the trigger circuit 52 does not couple voltage higher than the native voltage of the second nFET 30 to the gate of the second nFET 30.

During normal operation of the power supply, the trigger network 52 functions as a high pass filter and filters out low frequency events. When a high frequency high voltage transient, such as an ESD event occurs, the trigger circuit 52 couples the voltage transient to the gate of the second nFET 30, and switches the second nFET 30 into the on-state. The high voltage transient also switches the first nFET 32 into the fully on-state. With both the first nFET 32 and the second nFET 30 in the on-state, the voltage transient is shunted from the power supply rail 26 to the ground rail 28. The embodiment 200 can be configured to work with virtually any power supply configuration by adding more nFETs to the first two nFETs, 32 and 30, and corresponding adjustments to the bias network 42. For example, nFETs may be added in series with the first two nFETs, 32 and 30, to form a string of nFETs between the power and ground rails, 26 and 28, and making suitable adjustments to the bias network to properly bias the added nFETs.

It should be noted that because the capacitor network 46 and 48, are connected directly to the power supply rail 26, the voltage at the gate of 30 during an EDS event is higher than the trigger configuration of FIG. 1. The voltage is higher because during an ESD event the capacitor network 46 and 48 appear as a short. Thus, the gate of 30 is initially exposed to the full voltage of the ESD event, thereby turning the nFET 30 on more quickly.

Figure 3:
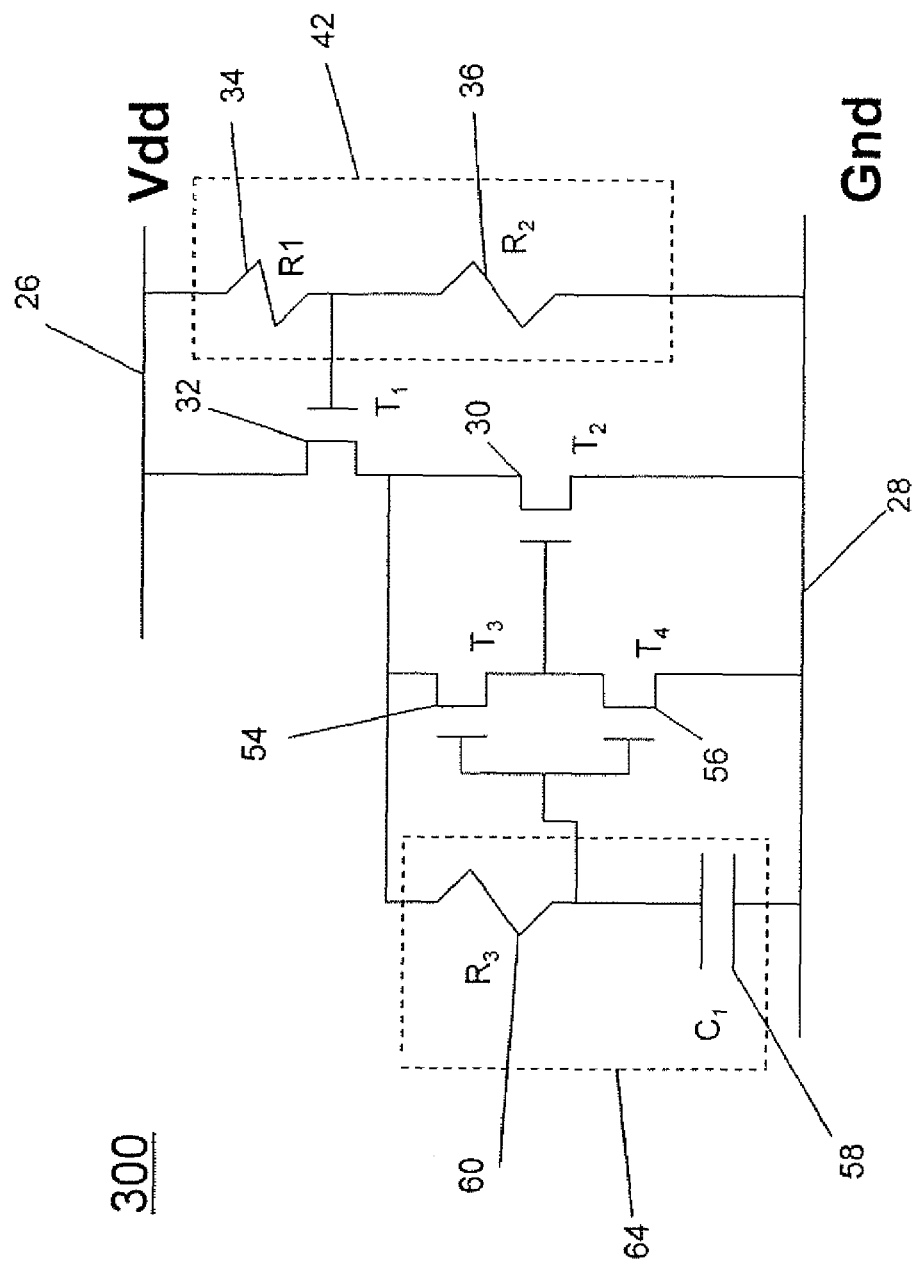
FIG. 3 illustrates an embodiment of the invention having an inverter.

Referring to FIG. 3, an alternate embodiment of the RC-trigger power clamp in accordance with the invention is shown. The power clamp 300 includes a first nFET 32 and a second nFET 30 connected in series with one another between a power supply rail 26 and a ground rail 28. The power clamp 300 also includes a first resistor 34 and a second resistor 36 connected in series with one another to form a resistor network 42 connected between the power rail 26 and the ground rail 28. The gate of the first nFET 32 is connected to the output of the first resistor 34 and the input of the second resistor 36.

A third resistor 60 and a first capacitor 58 connected in series with one another form a RC network 64. The RC network 64 is connected to the source of the first nFET 32 and the ground rail 28. Also connected between the source of the first nFET 32 and the ground rail 28 is a pFET 54 and a third nFET 56. The pFET 54 and the third nFET 56 are connected in series with one another with the drain of the pFET 54 and the drain of the third nFET 54 connected to one another. Additionally, the drain of the first pFET 54 and the drain of the third nFET 56 are connected to the gate of the second nFET 30, The gate of the pFET 54 and the third nFET 56 are connected to the output of the third resistor 60 and the input of the first resistor 58.

Figure 4:
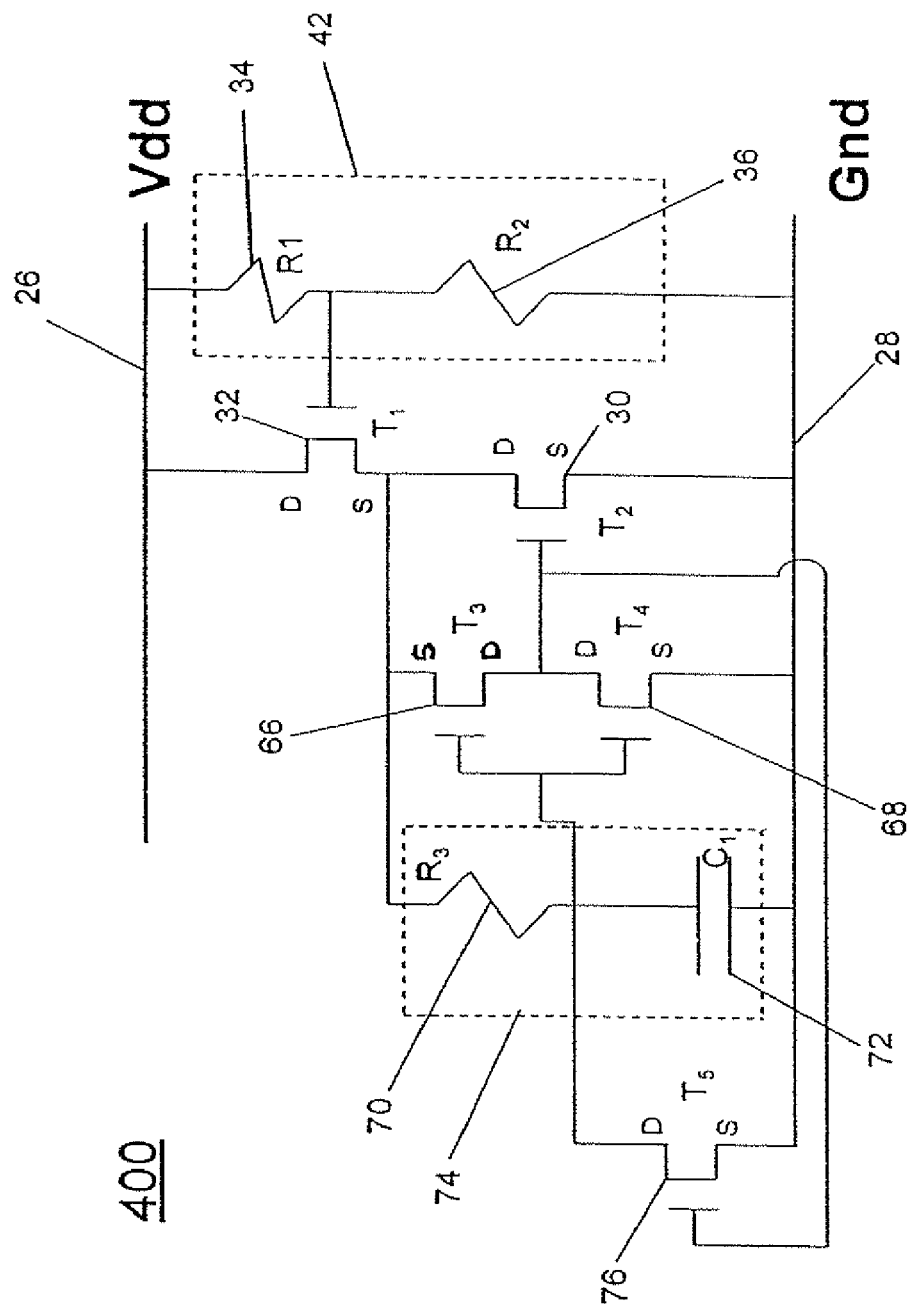
FIG. 4 illustrates an embodiment of the invention having a feedback circuit.

Referring to FIG. 4, an embodiment of a RC-triggered ESD power clamp in accordance with the invention is shown. The power clamp 400 includes a first nFET 32 and a second nFET 30 connected in a series with one another between a power supply rail 26 and a ground rail 28. The drain of the first nFET 32 is connected to the power supply rail 26, the source of the first nFET 32 is connected to the drain of the second nFET 30. The source of the second nFET 30 is connected to the ground rail 28. Resistors 34 and 36 are connected in series with one another to form a resistive network 42. The resistive network 42 is connected between the power supply rail 26 and the ground rail 28. The gate of the first nFET 32 is connected to the output of the first resistor 34 and the input of the second capacitor 36.

Connected to the source of the first nFET, 32 and the drain of the second nFET 30 is a third resistor 70. A first capacitor 72 is connected to the output of the third resistor 70 which forms an RC network 74. The RC network 74 is connected between the source of the first nFET 32 and the ground rail 28.

Also connected to the source of the first nFET 32 is a pFET 66 and connected to the pFET, 66 is a third nFET 68. The source of the pFET, 66 is connected to the source of the first nFET 32 and the drain of the third nFET 68 is connected to the drain of the pFET 66. The drain of the pFET 66 is connected to the gate of the second nFET 30. The drain of the third nFET 68 is connected to the gate of the second nFET 30.

The gate of the pFET 66 and the gate of the third nFET 68 are connected to one another and connected to the output of the third resistor 70 of the RC network 74. Additionally, a fourth nFET 76 has its drain connected to the output of the third resistor 70, its gate connected to the gate of the second nFET 30, and its source connected to ground 28.

In operation, the resistive network 42 allows the first nFET 32 to be held in a partially on-state thereby distributing a portion of the voltage drop from the power rail 26 to the ground rail 28 across the first nFET 32. Thus, the second nFET 30 is exposed to only a portion of the total voltage between power supply rail 26 and the ground rail 28. Also, the pFET 66 the third nFET 68 form an inverter between the RC network 74 and the gate of the second nFET 30. The inverter tends to rectify the gate voltage towards the end of the ESD event and holds the gate of nFET 30 at the voltage of the source of the first nFET 32 until the capacitor 72 has charged up sufficiently to flip the inverter to the output of a low signal state.

The feedback nFET 76 is attached back to the input of the inverter devices 66 and 68. During an ESD event, as the capacitor 72 charges up and reaches a state of charge which will tend to put the inverter into an off-state, the feedback nFET 76 provides a short to ground which will tend to discharge the capacitor 72 thereby providing feedback to the inverter to maintain the second nFET 30 in an on-state until the ESD event has terminated.

Adding the feedback nFET 76 allows for a RC time constant short enough to be immune to chip power-up while still discharging the entire ESD event to the ground rail. In other words, the nFET 76 allows the power clamp to turn on during an ESD event, while at the same time, preventing the RC trigger from turning the power clamp off for a long duration ESD event. Thus, the feedback nFET 76 allows for greater design freedom in choosing the RC values of the RC trigger.

Figure 3A:
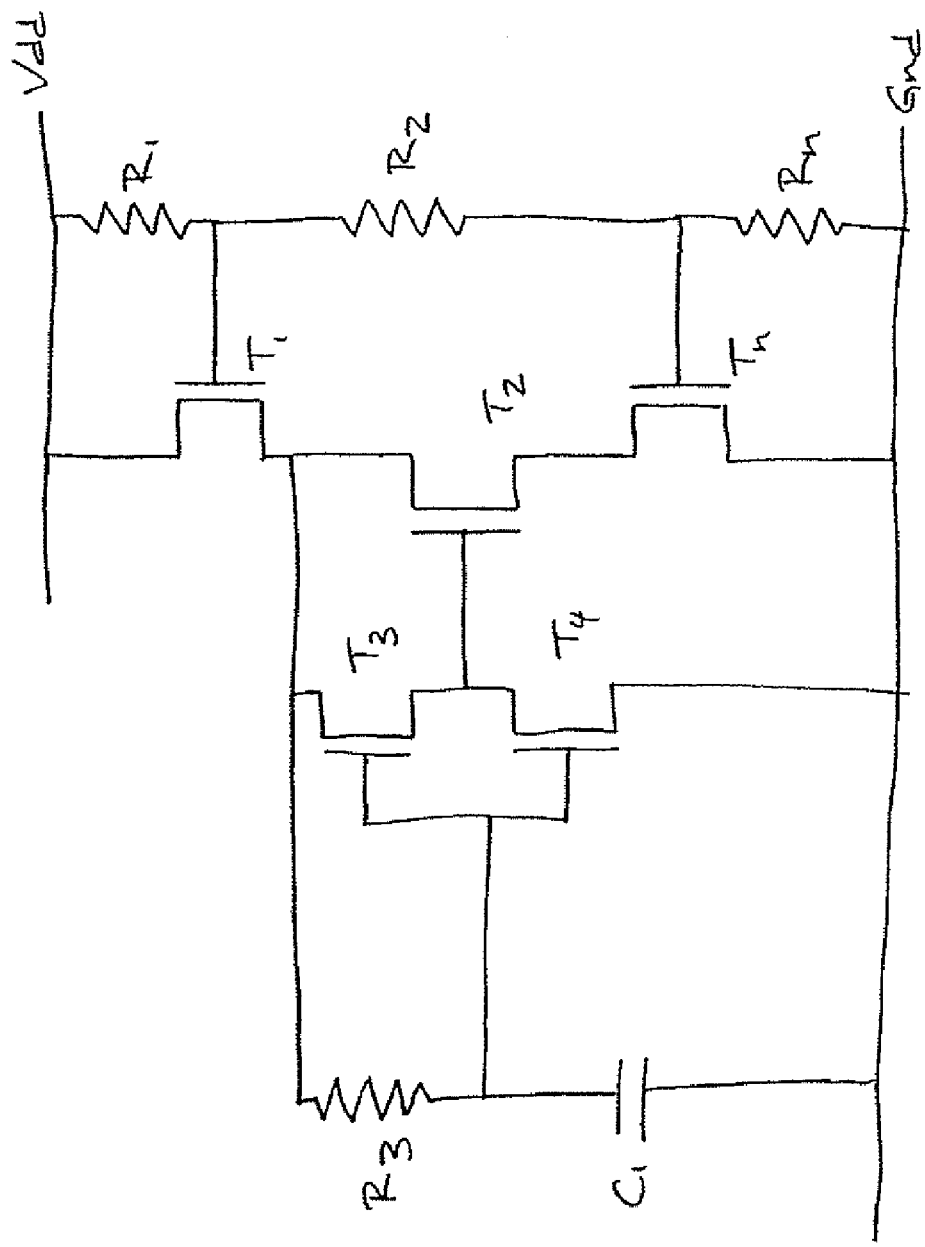
FIG. 3a illustrates an alternative embodiment of the invention depicted in FIG. 3.

It should be noted that although nFETs and pFETs are used in the above examples, any type of appropriate semiconductor device may be used in embodiments of the power clamp circuit and remain within the scope of the invention. It should also be noted that in FIGS. 3 and 4, although a single inverter network is shown, any suitable number of network inverters may be incorporated into the circuit to allow the power clamp to work at any desired voltage. Incorporating additional inverters into the circuit may also require additional corresponding capacitors, and/or resistors in the RC-trigger network as should be understood by those of ordinary skill in the art. Additionally, in FIGS. 3 and 4, any number of transistor-like devices may be used in connection with the first and second nFETs 32 and 30 in order to allow the power clamp to function in virtually in any voltage environment, and corresponding additions to the resistive network to bias the additional nFETs, see, e.g., transistor Tn and resistor Rn depicted in FIG. 3a. Although nFETs and pFETs are used for illustration purpose, any type of switching device suitable to the task may be used for the operation of the power clamp.

For all of the power clamps shown, the RC time constant of the trigger network is generally configured to short enough that the RC network will not trigger the power clamp during normal power up of the chip. However, the RC time constant must also be long enough so that the RC network properly triggers the power clamp during an ESD event. For example, a RC time constant of about 1 μS has been generally found to be a suitable time constant for typically power clamps as applied to typical circuits needing protecting against ESD events.

Figure 5:
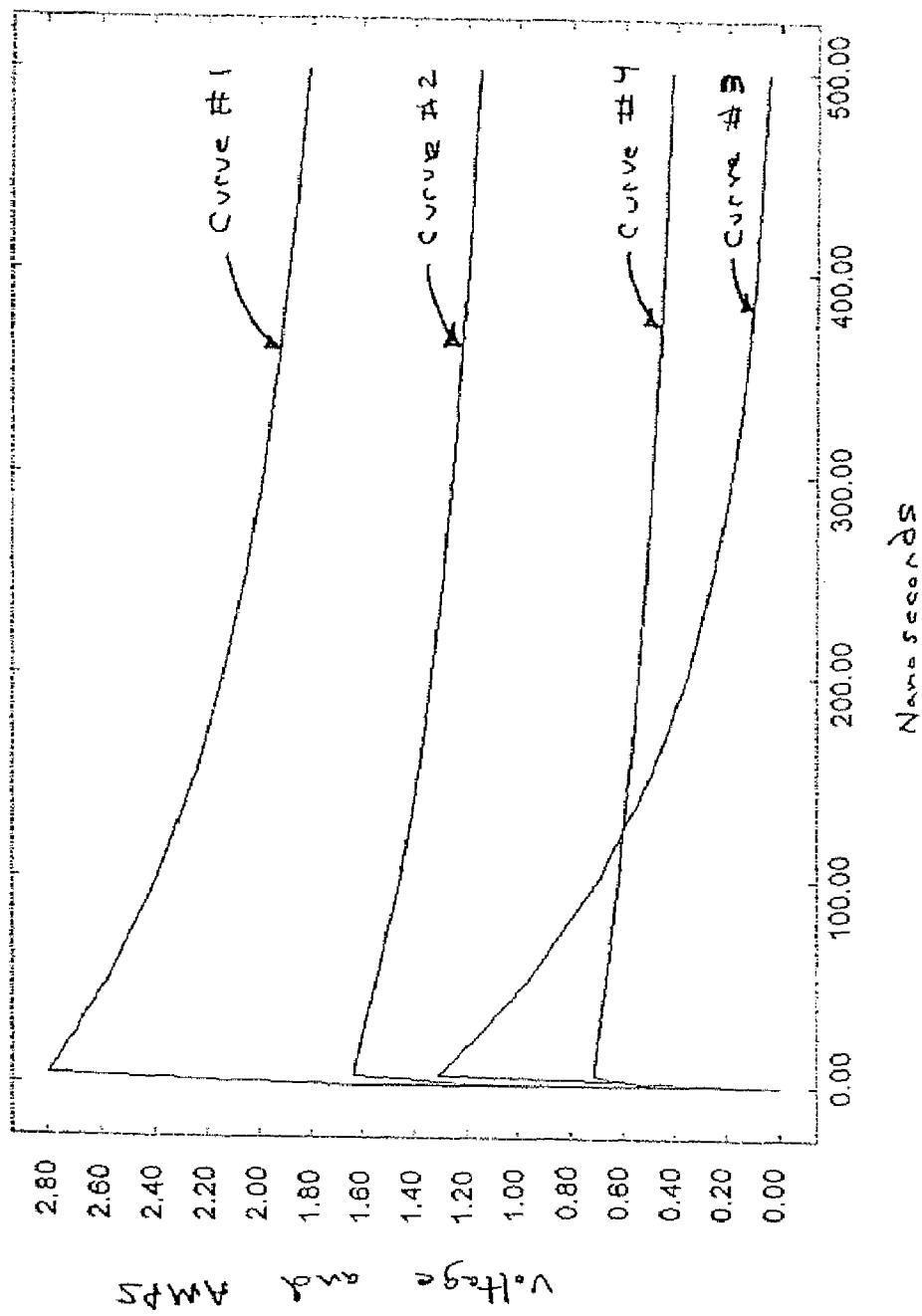
FIG. 5 illustrates voltage and current curves of an embodiment of the invention.

Referring to FIG. 5, voltage and current curves versus time are shown for the embodiment of the RC trigger power clamp shown in FIG. 1. In FIG. 5, the Y axis is volts and amps, and the X axis is in nanoseconds.

The curve labeled Curve #1 is the voltage as a function of time during an ESD event on the power rail. During the ESD event, the Curve #2 is the voltage at the gate of the first nFET Ti. Curve #3 represents the voltage going across the first and second nFETs, The Curve #4 represents voltage at the source of the second nFET. These curves represent a 2000 volt ESD event with a peak of about 1.3 amps.

During an ESD event, the voltage of the power supply rail raises to a predetermined value at which point the voltage at the gate of the first nFET has also risen to a value of approximately half of the value of the voltage at the power rail due to the resistor network. As Curve #3 shows, once the voltage at the gate of the first nFET reaches a predetermined value, the power clamp begins conducting current to ground and the current relatively slowly decays with time. As Curve #4 shows, the voltage on the gate of the second nFET is maintained at a substantially constant 0.7 volts indicating that the power clamp continues to be in the on-state and conducting current between the power supply rail and ground.

For example, during an ESD event, the voltage on the power supply (Curve #1) rises to a predetermined value of about 2.8V while the voltage at the gate of the first nFET (Curve #2) rises to about 1.6V before the power clamp is switched into the on-state during an ESD event. The voltage across the first and second nFETs (Curve #3) rises to about 1.3V and the voltage at the second nFET (Curve #4) rises to about 0.7V before the power clamp shunts the ESD event to the ground rail. As FIG. 5 shows, all values immediately drop when the power clamp is triggered.

Figure 6:
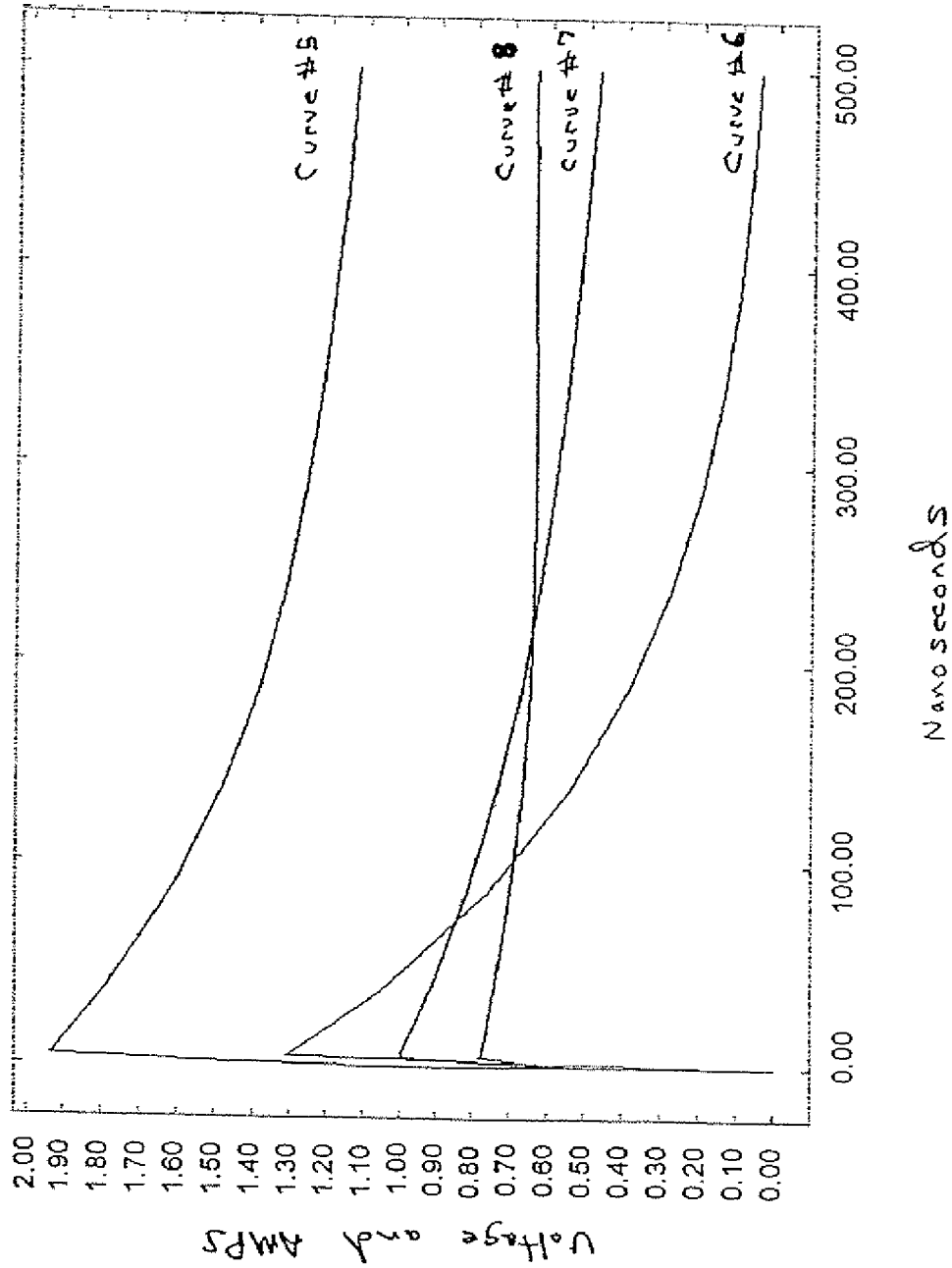
FIG. 6 illustrates voltage and current curves of an embodiment of the invention.

Referring to FIG. 6, a graph with axis similar to that FIG. 5 is shown for an embodiment of the RC-trigger power clamp shown in FIG. 2. Curve #5 shows the voltage at the power supply rail. Curve #6 shows the current across the power clamp. Curve #7 shows the voltage on the gate on the second nFET. Curve #8 shows voltage on the gate on the first nFET.

As the voltage on the power rail, as indicated by Curve #5, raises, the voltage on the gate of the second nFET raises as indicated by Curve #7, and the voltage on the gate of the first nFET rises as represented by Curve #8. Once the voltage on the gate of the second nFET reaches a predefined value, the power clamp turns on and shunts current from the power rail to the ground rail as indicated by the current flowing across the power clamp of Curve #6. As indicated in FIG. 6, the embodiment in FIG. 3 turns on faster and clamps the voltage across the power clamp to a lower value than the embodiment of the power clamp represented by FIG. 1. Accordingly, the embodiment represented by FIG. 6 produces greater current protection against an ESD event.

For example, during an ESD event, the voltage on the power supply (Curve #5) rises to a predetermined value of about 1.95V while the voltage at the gate of the first nFET (Curve #6) rises to about 1.3V before the power clamp is switched into the on-state during an ESD event. The voltage across the first and second nFETs (Curve #7) rises to about 1.0V and the voltage at the second nFET (Curve #8) rises to about 0.75V before the power clamp shunts the ESD event to the ground rail. As FIG. 6 shows, all values immediately drop when the power clamp is triggered.

While the invention has been described in terms of exemplary embodiments, those skilled in the art will recognize that the invention can be practiced with modifications and in the spirit and scope of the appended claims,

What is claimed:

1. A method of protecting against electrostatic discharge, comprising:
    configuring a gate of at least one upper transistor of a transistor network connected between power rails to be biased to a prescribed value;
    coupling an electrostatic discharge event to a gate of a lower transistor of the transistor network through the at least one upper transistor, wherein the at least one upper and at least one lower transistors of the transistor network are respectively coupled between the power rails from a higher voltage to a lower voltage; and
    coupling an electrostatic discharge event to the gate of the lower transistor with a high pass filter.

2. The method of claim 1, further comprising configuring the high pass filter to comprise a time constant of about one microsecond.

* * * * *